(12) United States Patent
Ono et al.

(10) Patent No.: US 7,629,864 B2
(45) Date of Patent: Dec. 8, 2009

(54) FILTER INCLUDING ACOUSTIC WAVE FILTERS CONNECTED IN PARALLEL

(75) Inventors: Satoru Ono, Yokohama (JP); Osamu Kawachi, Yokohama (JP); Hidemitsu Kuboi, Yokohama (JP); Kouta Ohkubo, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 139 days.

(21) Appl. No.: 11/972,336

(22) Filed: Jan. 10, 2008

(65) Prior Publication Data

US 2008/0169882 A1 Jul. 17, 2008

(30) Foreign Application Priority Data

Jan. 11, 2007 (JP) .............................. 2007-003930

(51) Int. Cl.
*H03H 9/00* (2006.01)
*H03H 9/64* (2006.01)
*H03H 9/215* (2006.01)

(52) U.S. Cl. ...................................... 333/133; 333/193
(58) Field of Classification Search .................. 333/133, 333/193, 194, 195, 196
See application file for complete search history.

(56) References Cited

U.S. PATENT DOCUMENTS

| 7,212,086 B2 * | 5/2007 | Nishizawa ................. 333/193 |
| 7,425,878 B2 * | 9/2008 | Inoue et al. ................. 333/133 |
| 2002/0135267 A1 | 9/2002 | Takamine | |

FOREIGN PATENT DOCUMENTS

| JP | 11-68512 A | 3/1999 |
| JP | 2001-358556 A | 12/2001 |
| JP | 2002-208832 A | 7/2002 |
| JP | 3480445 B2 | 10/2003 |

* cited by examiner

*Primary Examiner*—Dean O Takaoka
(74) *Attorney, Agent, or Firm*—Arent Fox LLP

(57) ABSTRACT

A filter includes: a first acoustic wave filter having acoustic wave filters cascaded, an input stage of the acoustic wave filters including a first multimode filter; a second acoustic wave filter having acoustic wave filters cascaded, an input stage of these acoustic wave filters including a second multimode filter having an aperture length different from that of the first multimode filter, the second acoustic wave filter receiving an unbalanced in signal applied to the first acoustic wave filter, and having a pass band that does not overlap with that of the first acoustic wave filter.

9 Claims, 22 Drawing Sheets

FILTER INCLUDING ACOUSTIC WAVE FILTERS CONNECTED IN PARALLEL

BACKGROUND OF THE INVENTION

1. Field of the Invention

The present invention generally relates to filters, and more particularly, to a filter including acoustic wave filters connected in parallel.

2. Description of the Related Art

Recently, cellular phones and potable information terminal equipment have rapidly become widespread due to the progress of mobile communication systems. For example, the cellar phone terminals use a frequency range as high as 800 MHz to 1.0 GHz or 1.5 GHz to 2.0 GHz. In the communication fields as mentioned above, acoustic wave filters such as surface acoustic wave (SAW) filters are used. There is a demand for a SAW filter having a wide band. For example, some cellular phone terminals require a wide multi-band SAW filter capable of covering communication bands of two or more communication systems.

However, there is a difficultly in realizing filters capable of two or more bands and having low insertion loss. In view of the above circumstance, there is a proposed filter equipped with multiple acoustic wave filters that are connected in parallel and have bands of respective communication systems.

Japanese Patent Application Publication No. 11-68512 discloses a filter that uses two acoustic wave filters and has a single input and two unbalanced outputs. Japanese Patent No. 3480445 discloses a filter that uses two acoustic wave filters and has a single input and two balanced outputs. The two acoustic wave filters are connected in parallel with regard to a single input. It is required that one of the two filters has a high impedance in the pass band of the other filter in order to realize a filtering operation such that the two filters allow signals to pass in the respective pass bands and block signals outside of the respective pass bands.

In order to realize the above filtering operation, the above applications propose the use of a series resonator inserted between the acoustic wave filters and the input (common) terminal. The series resonator realizes an impedance adjustment such that one of the two filters has high impedance in the pass band of the other filter.

However, the series resonator increases the insertion loss and prevents downsizing of the filter.

SUMMARY OF THE INVENTION

The present invention has been made in view of the above circumstance, and provides a filter in which degradation of the insertion loss can be avoided and downsizing can be realized According to an aspect of the present invention, there is provided a filter including: a first acoustic wave filter having acoustic wave filters cascaded, an input stage of the acoustic wave filters including a first multimode filter; a second acoustic wave filter having acoustic wave filters cascaded, an input stage of these acoustic wave filters including a second multimode filter having an aperture length different from that of the first multimode filter, the second acoustic wave filter receiving an unbalanced input signal applied to the first acoustic wave filter, and having a pass band that does not overlap with that of the first acoustic wave filter.

DESCRIPTION OF PREFERRED EMBODIMENTS

A description will now be given of embodiments of the present invention with reference to the accompanying drawings.

First Embodiment

Figure 1:
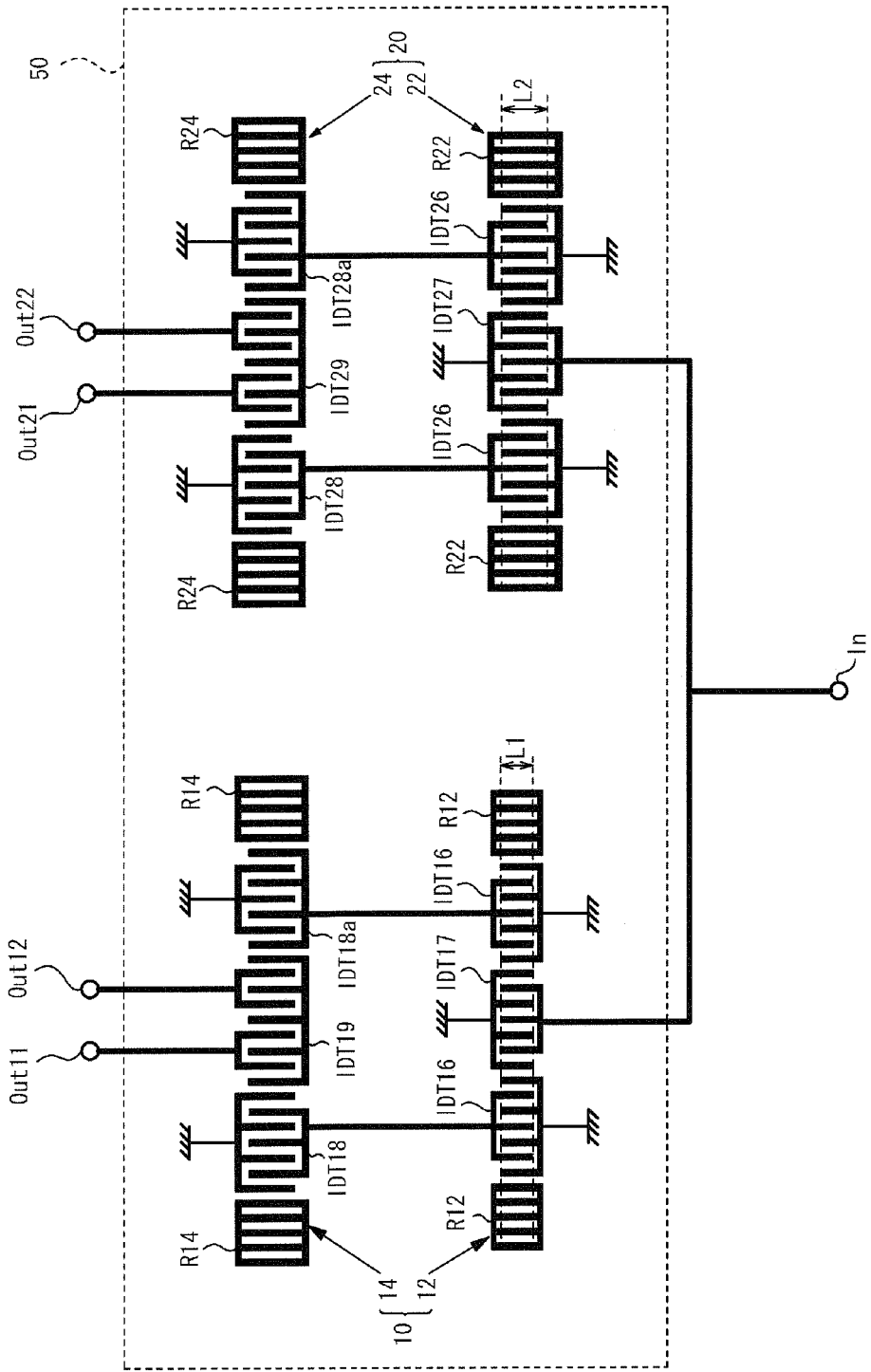
FIG. 1 is a schematic plan view of a filter in accordance with a first embodiment.

FIG. 1 is a schematic plan view of a first embodiment of the present invention in which some fingers of interdigital transducers (IDTs) and reflectors are omitted for the sake of simplicity. This omission holds true for the other figures. A filter of the first embodiment has a first acoustic wave filter 10 and a second acoustic wave filter 20. The first acoustic wave filter 10 receives an input signal applied to an unbalanced input terminal In (common terminal) and outputs it to balanced output terminals Out11 and Out12. The second acoustic wave filter 20 receives an input signal applied to the input terminal In and outputs it to balanced output terminals Out21 and Out22.

The first acoustic wave filter 10 has a first multimode filter 12 of an input stage and a multimode filter 14 of an output stage, which filters are cascaded. The first multimode filter 12 has an input IDT 17, two output IDTs 16 arranged at both sides of the input IDT 17, and reflectors R12 further out than the two output IDTs 16. The input signal is applied to the input IDT 17 via the input terminal In, and is then applied to the multimode filter 14 from the output IDTs 16. The multimode filter 14 has an output IDT 19, two input IDTs 18 and 18a arranged at both sides of the output IDT 19, and reflectors R14 further out than the two input IDTs 18 and 18a. Two outputs of the first multimode filter 12 are respectively applied to the input IDTs 18 and 18a of the multimode filter 14. The input IDTs 18 and 18a of the multimode filter 14 have different arrangements of electrode fingers so that two balanced output signals that are 180° out of phase are respectively applied to the output terminals Out11 and Out12 from the output IDT 19.

The second acoustic wave filter 20 has a second multimode filter 22 of an input stage, and a multimode filter 24 of an output stage, which filters are cascaded. The structures of the two multimode filters 22 and 24 are the same as those of the above-mentioned multimode filters 12 and 14, and a description thereof will be omitted. The first multimode filter 12 and the second multimode filter 22 have mutually different aperture lengths L1 and L2, respectively. The aperture length is a length over which the two interleaving electrode fingers laterally overlap each other.

The first acoustic wave filter 10 and the second acoustic wave filter 20 are formed on an identical piezoelectric substrate 50. The IDTs 16 through IDTs 29 and the reflectors R12 through R24 are metal films formed on the piezoelectric substrate 50.

Figure 2:
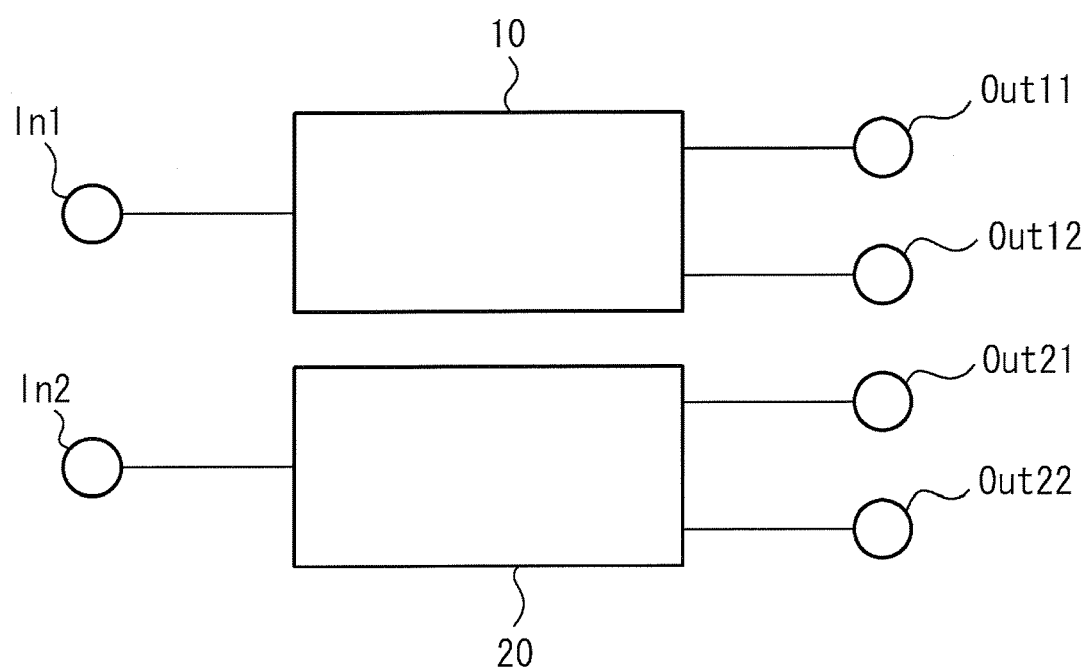
FIG. 2 is a block diagram of the filter of the first embodiment before input terminals of built-in filters are connected.

A description will now be given of the relationship between the aperture length L1 of the first multimode filter 12 and the aperture length L2 of the second multimode filter 22 employed in the filter of the first embodiment. FIG. 2 is a block diagram of an arrangement of the filter of the first embodiment configured before the input terminals of the filters 10 and 20 are connected to the common input terminal In. That is, the first acoustic wave filter 10 has an unbalanced input terminal In1 and balanced output terminals Out11 and Out12. Similarly, the second acoustic wave filter 20 has an unbalanced input terminal In2 and balanced output terminals Out21 and Out22.

Figure 3:
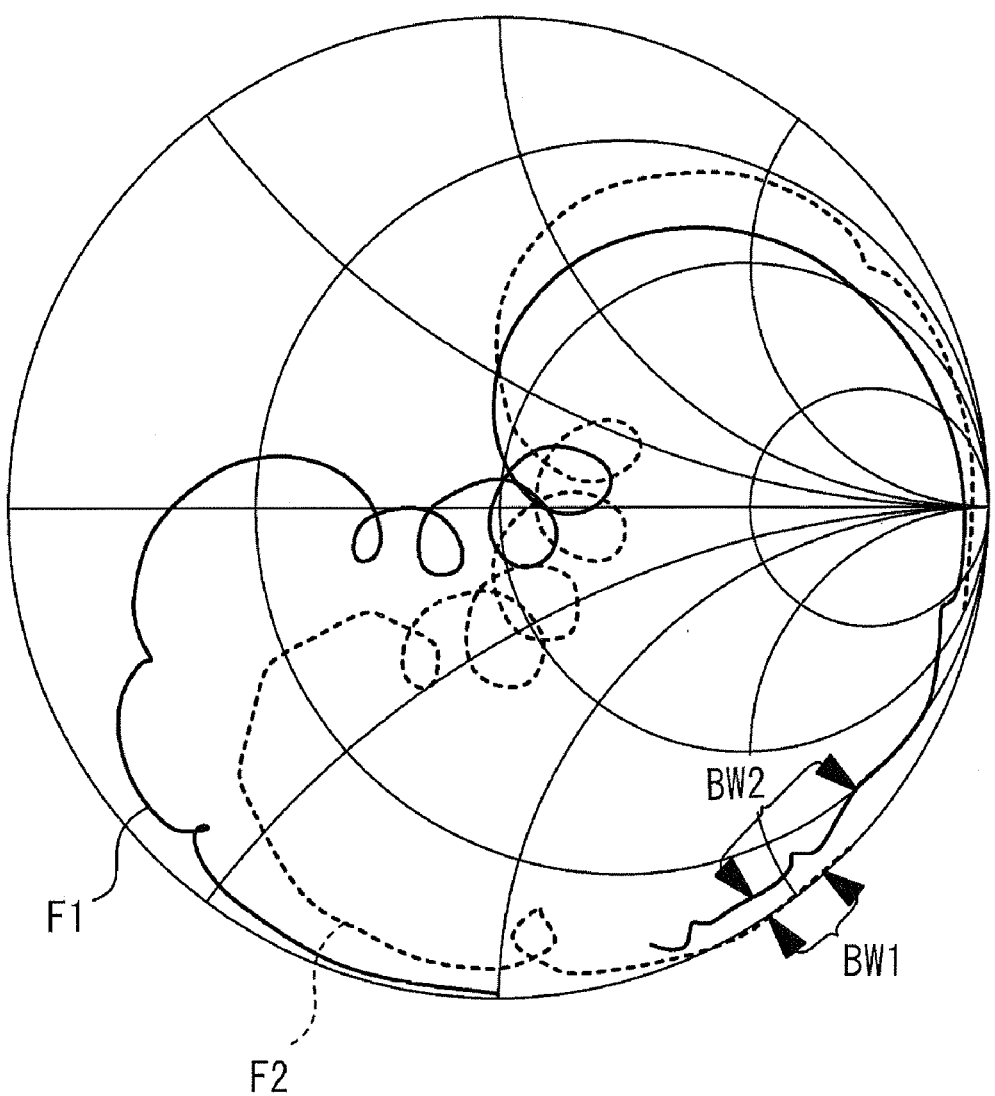
FIG. 3 is a Smith chart of the input impedances of a first acoustic wave filter and a second acoustic wave filter.

FIG. 3 is a Smith chart of input impedances of the first and second acoustic wave filters 10 and 20. Symbols F1 and F2 respectively denote input signals of the first and second acoustic wave filters 10 and 20. As to the input signal F1, the pass band of the second acoustic wave filter 20 is indicated by BW2. Similarly, as to the input signal F2, the pass band of the first acoustic wave filter 10 is indicated by BW1. The frequencies of the pass bands BW1 and BW2 do not overlap each other. Thus, if the first and second acoustic wave filters 10 and 20 have almost the same input impedance values (particularly, the reactance components), the phase of the input signal F1 in the pass band BW2 and the phase of the input signal F2 in the pass band BW1 will differ from each other. According to the first embodiment, the phase of the input signal F1 in the pass band BW2 and the phase of the input signal F2 in the pass band BW1 almost overlap with each other by adjusting the aperture length L1 of the first multimode filter 12 and the aperture length L2 of the second multimode filter 22 of the first and second acoustic wave filters 10 and 20. That is, the different aperture lengths L1 and L2 make a difference in reactance component (particularly, a capacitive component) between the first and second acoustic wave filters 10 and 20. It is thus possible to adjust the phases of the input signals F1 and F2.

Figure 4:
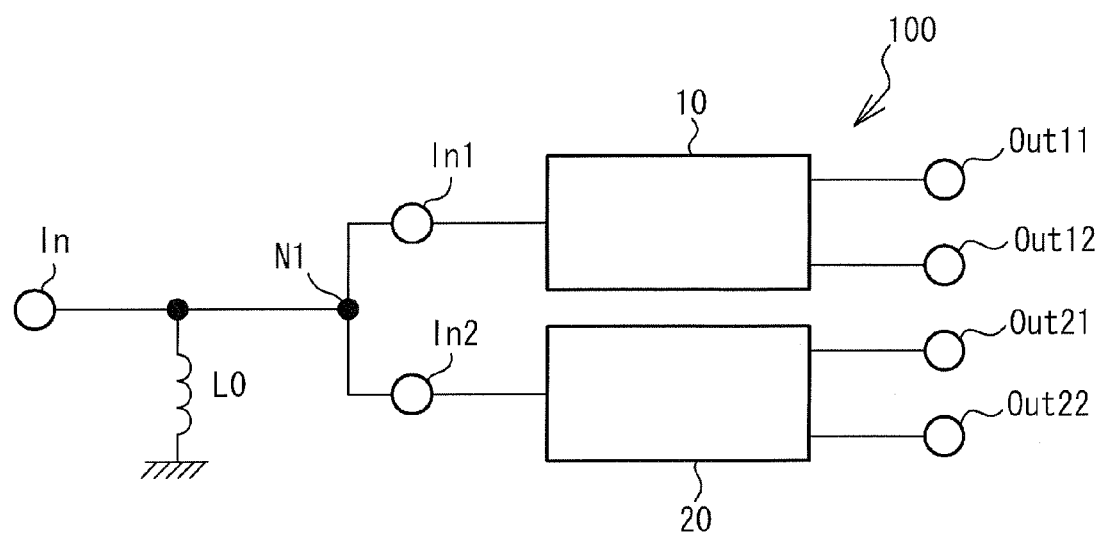
FIG. 4 is a block diagram of the filter of the first embodiment.

Referring to FIG. 4, there is illustrated a filter having a node N1 to which the input terminals In1 and In2 of the first acoustic wave filters 10 and 20 are connected. The node N1 is connected to the common input terminal In. The filter 100 has an inductor L0, which is a matching circuit connected to the input terminal In in parallel. With this structure, signal components of the input signal applied to the input terminal In in the pass band BW1 of the first acoustic wave filter 10 are applied to the output terminals Out11 and Out12, and signal components thereof in the pass band BW2 of the second acoustic wave filter 20 are applied to the output terminals Out21 and Out22.

Figure 5A:
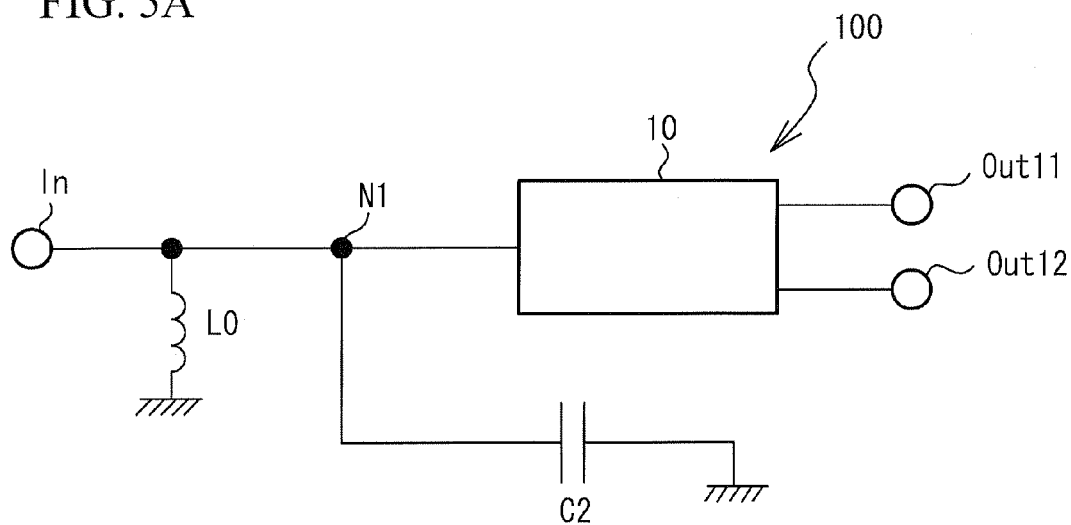
FIGS. 5A and 5B are equivalent circuits of the filter of the first embodiment.
Figure 5B:
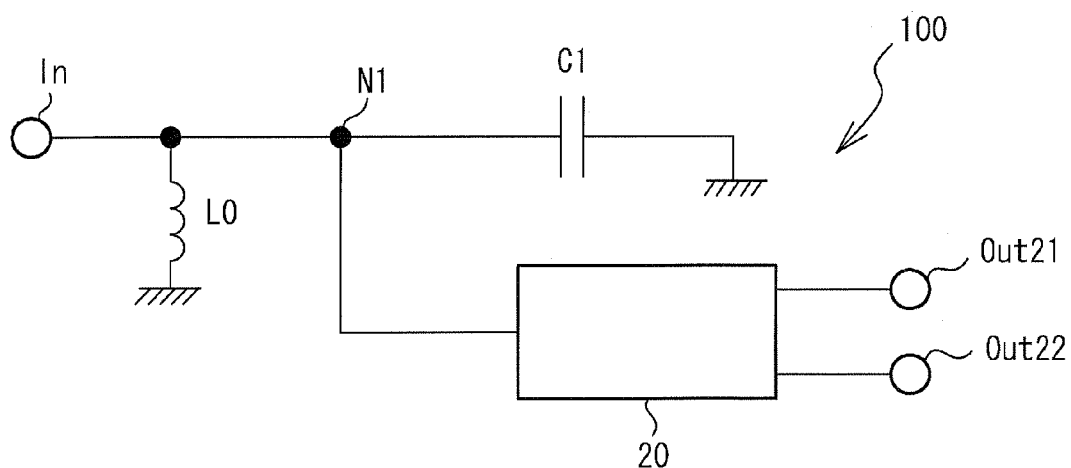

FIGS. 5A and 5B are respectively equivalent circuit diagrams of two cases where signals in the pass bands BW1 and BW2 are applied to the input terminal In of the filter 100, respectively. Referring to FIG. 5A, the equivalent circuit of the second acoustic wave filter 20 is a capacitor C2 connected in parallel with the input terminal In with respect to signals in the pass band BW1 of the first acoustic wave filter 10. Referring to FIG. 5B, the equivalent circuit of the first acoustic wave filter 10 is a capacitor C1 connected in parallel with the input terminal In with respect to signals in the pass band BW2 of the second acoustic wave filter 20.

Figure 6:
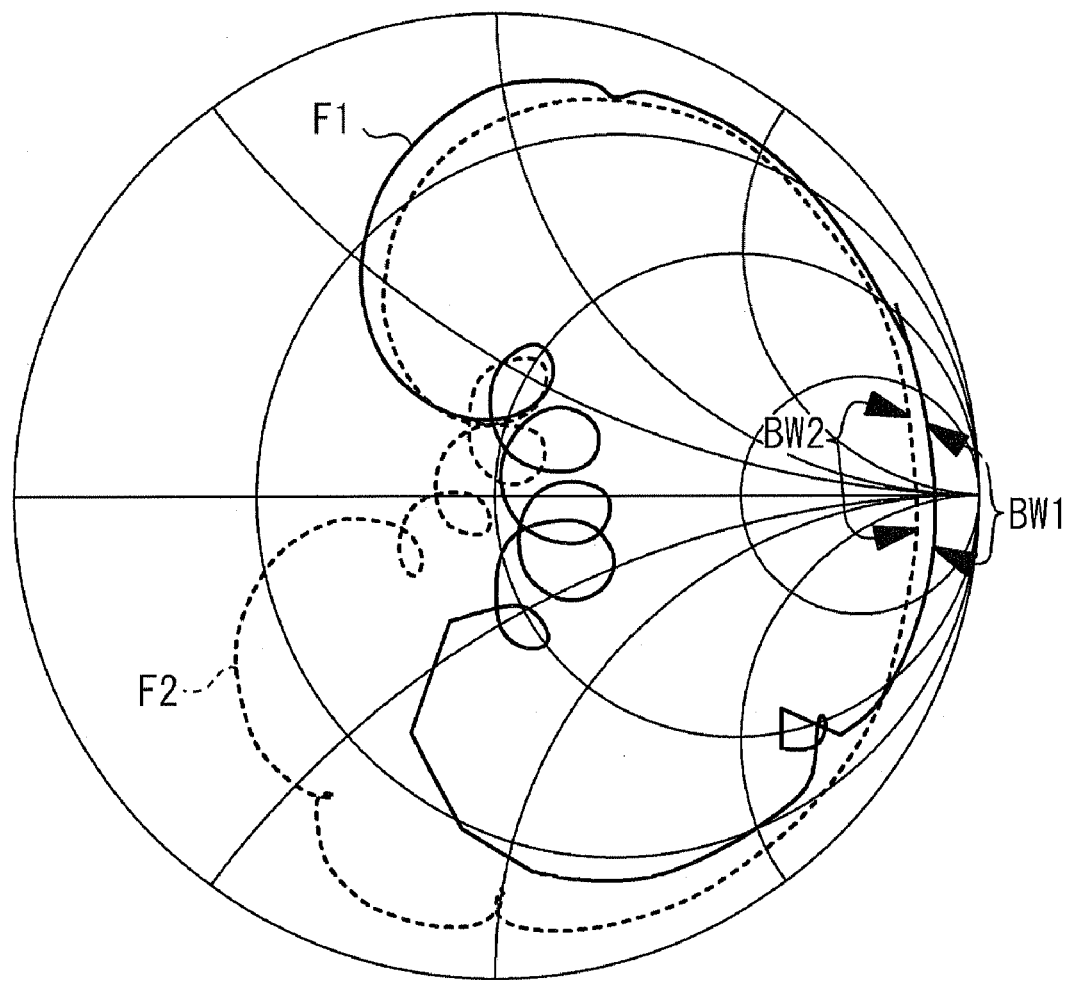
FIG. 6 is a Smith chart of S11 of the first and second acoustic wave filters viewed from the input terminal of the filter of the first embodiment.

FIG. 6 is a Smith chart of input impedances of the first and second acoustic wave filters 10 and 20 viewed from the input terminal In of the filter 100. The inductor L0 connected to the input terminal In in parallel cancels the capacitive component C1 or C2 and sets the phases of the signals F1 and F2 in the pass bands BW2 and BW1 approximately equal to 0°. In FIG. 3, the band BW2 of the signal F1 and the band BW1 of the signal F2 overlap each other. Thus, in FIG. 6, the phases of the signals F1 and F2 can be set approximately equal to 0° in a state in which these phases overlap each other.

Figure 7:
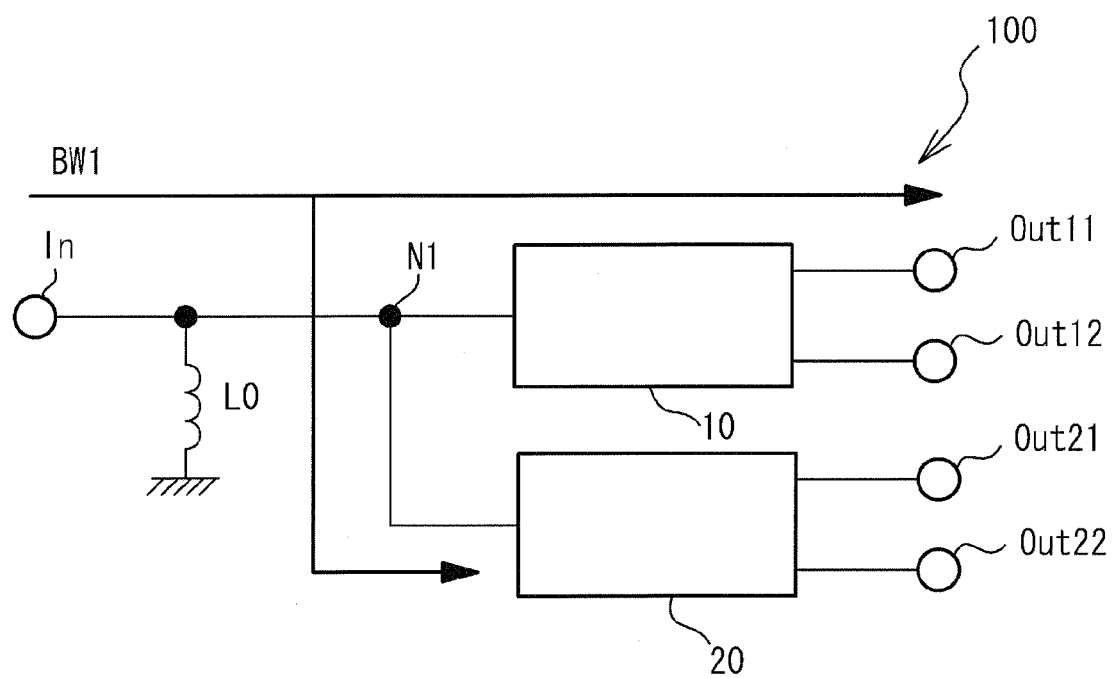
FIG. 7 shows a case where a signal in the pass band of the first acoustic wave filter is applied.
Figure 8A:
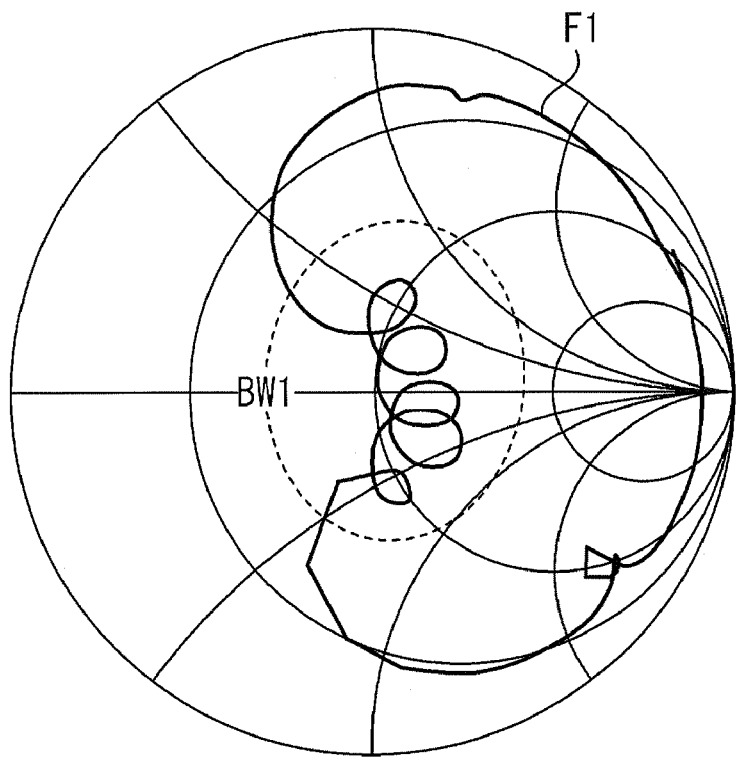
FIGS. 8A and 8B are Smith charts of S11 of the first and second acoustic wave filters viewed from the input terminals, respectively.
Figure 8B:
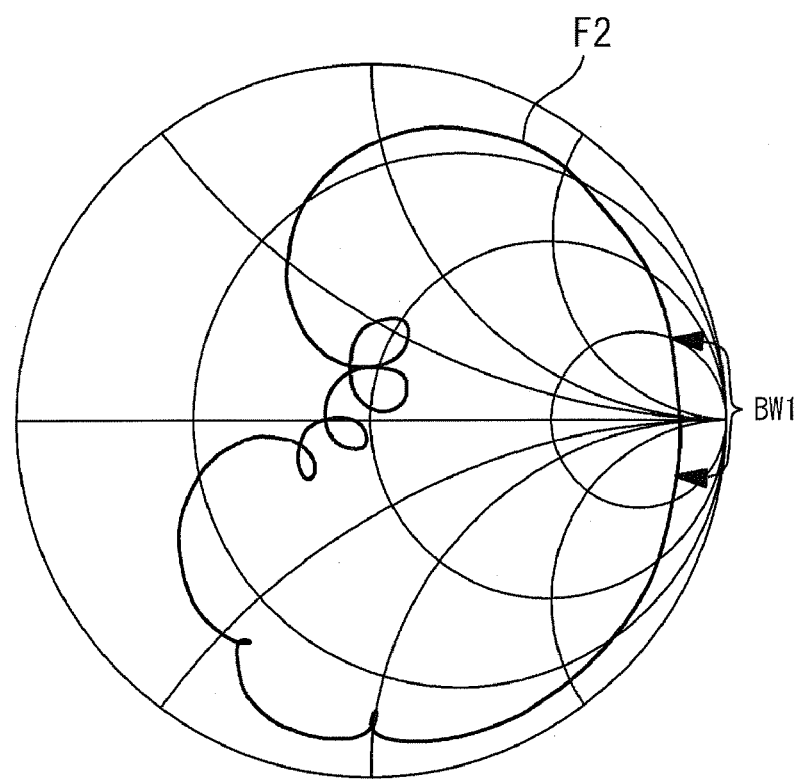

FIG. 7 schematically shows the filter 100 in which a signal in the pass band BW1 of the first acoustic wave filter 10 is applied to the input terminal In. FIGS. 8A and 8B are respectively Smith charts of the input impedances of the first and second acoustic wave filters 10 and 20 viewed from the input terminal In in the circuits shown in FIGS. 5A and 5B, respectively. Referring to FIG. 8A, the signal F1 in the pass band BW1 is located close to the center of the Smith chart. That is, the reflection coefficient of the first acoustic wave filter 10 is approximately equal to zero, and the first acoustic wave filter 10 is in the impedance-matched state. Referring to FIG. 8B, the phase of the signal F2 in the pass band BW1 is approximately 0°, and is located in a peripheral portion of the Smith chart. That is, the second acoustic wave filter 20 is in a high-impedance state. Thus, as shown in FIG. 7, the signal in the pass band BW1 passes through the first acoustic wave filter 10, and is blocked by the second acoustic wave filter 20. Thus, the signal in the pass band BW1 is not leaked from the second acoustic wave filter 20, so that the insertion loss of the first acoustic wave filter 10 can be improved.

Figure 9:
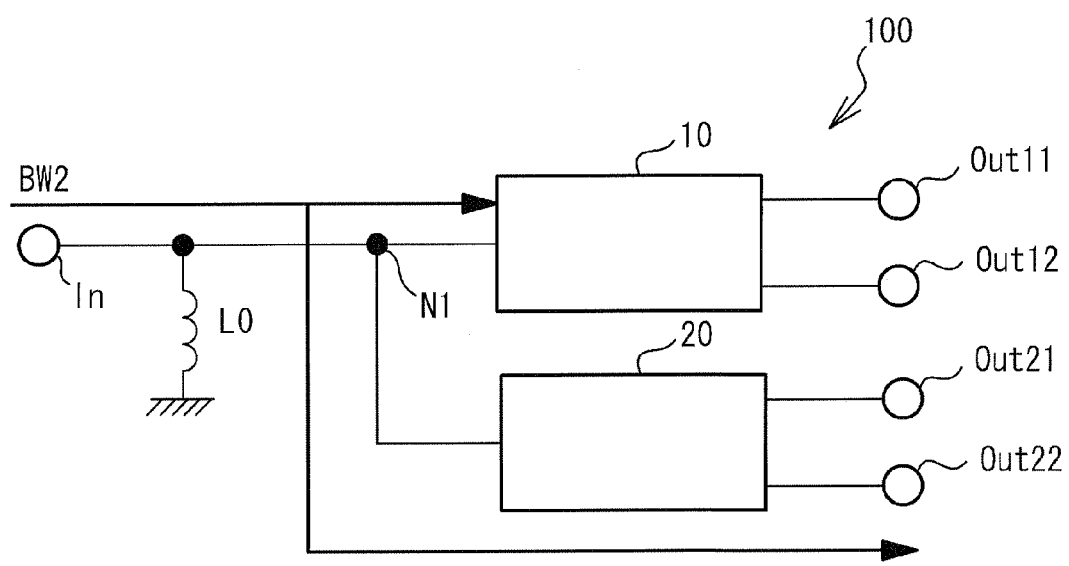
FIG. 9 shows a case where a signal in the pass band of the second acoustic wave filter is applied.
Figure 10A:
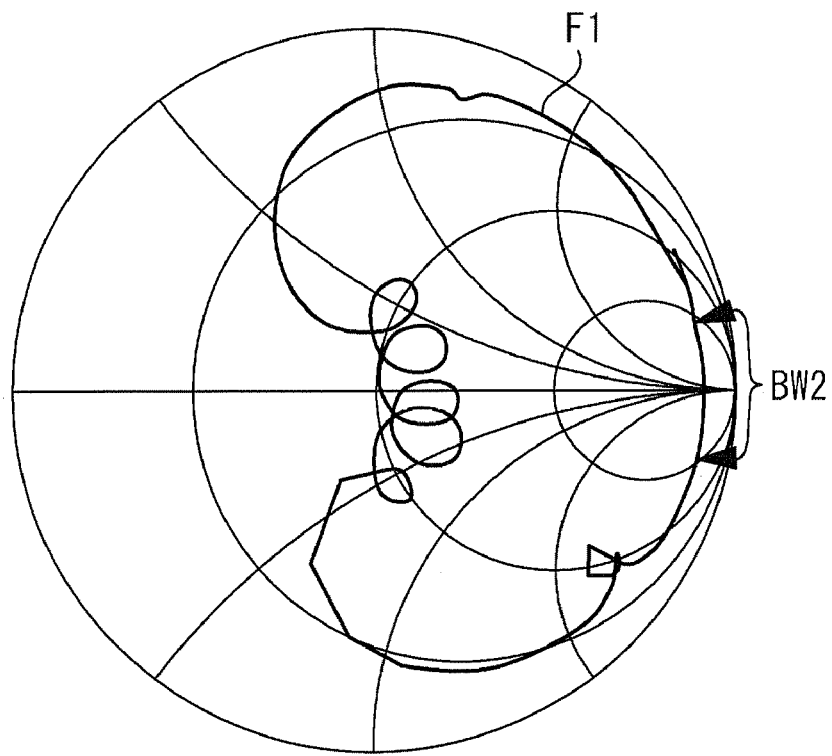
FIGS. 10A and 10B are Smith charts of S11 of the first and second acoustic wave filters viewed from the input terminals.
Figure 10B:
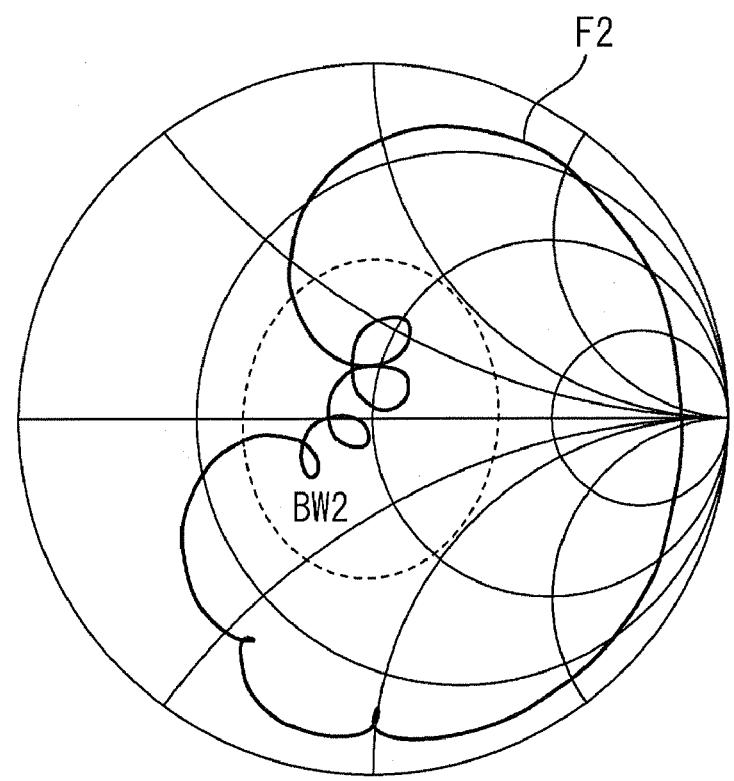

FIG. 9 schematically shows the filter 100 in which a signal in the pass band BW2 of the second acoustic wave filter 20 is applied to the input terminal In. FIGS. 10A and 10B are respectively Smith charts of the input impedances of the first and second acoustic wave filters 10 and 20 viewed from the input terminal In in the circuits shown in FIGS. 5A and 5B, respectively. Referring to FIGS. 10A and 10B, the first acoustic wave filter 10 is in a high-impedance state in the pass band BW2, and the second acoustic wave filter 20 is in an impedance-matched state. Thus, as shown in FIG. 9, the signal in the pass band BW2 passes through the second acoustic wave filter 20, and is blocked by the first acoustic wave filter 10.

According to the first embodiment, as shown in FIG. 1, the aperture length L1 of the first multimode filter 12 at the input stage and the aperture length L2 of the second multimode filter 22 differ from each other in the first and second acoustic wave filters 10 and 20 receiving the identical unbalanced signal and having the respective pass bands that do not overlap each other. Thus, the adjustment of the aperture lengths L1 and L2 makes it possible for the phases of the signals F1 and F2 in the pass bands BW2 and BW1 to overlap each other, as shown in FIG. 3. Thus, as shown in FIG. 6, the impedances can easily be matched by the inductor L0 functioning as the impedance matching circuit while the phases of the signals F1 and F2 in the pass bands BW2 and BW1 can be kept substantially identical. Further, the present invention does not need any series resonator as described in the aforementioned applications, so that degradation of the insertion loss can be avoided and downsizing can be realized.

Figure 11:
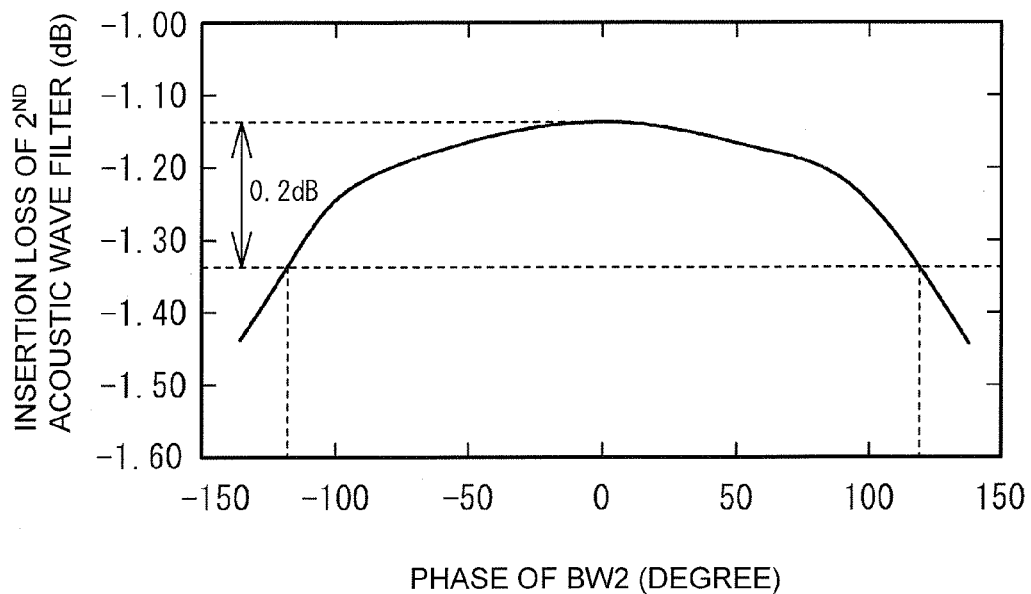
FIG. 11 is a graph of the insertion loss of the second acoustic wave filter with respect to the phase of the pass band of the second acoustic wave filter.

FIG. 11 is a graph of the insertion loss (dB) of the second acoustic wave filter 20 as a function of the phase of the input signal F1 of the first acoustic wave filter 10 in the pass band BW2 in the filter 100. Referring to FIG. 11, the insertion loss is minimized when the phase of the signal F1 in the pass band BW2 is 0°. That is, the smallest amount of signal in the pass band BW1 of the first acoustic wave filter 10 is leaked from the second acoustic wave filter 20. The insertion loss increases as the phase of the signal F1 in the pass band BW2 become away from 0°. In order to suppress degradation of the insertion loss to −0.2 dB or lower with respect to a specific insertion loss, the phase of the signal F1 in the pass band BW2 must be greater than or equal to −120° and less than or equal to 120°, it is preferable that the phase of the signal F1 in the pass band BW2 is greater than or equal to −100° and less than or equal to 100°. This holds true for the phase of the signal F2 in the pass band BW1.

Figure 12:
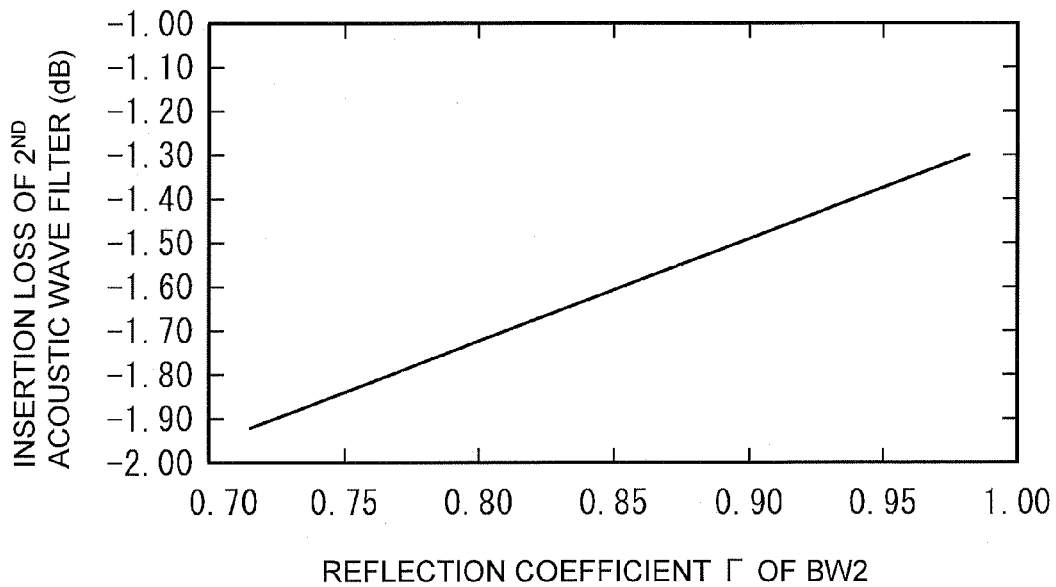
FIG. 12 is a graph of the insertion loss of the second acoustic wave filter with respect to the reflection coefficient in the pass band of the second acoustic wave filter.

FIG. 12 is a graph of the insertion loss (dB) of the second acoustic wave filter 20 as a function of the reflection coefficient F of the input signal F1 of the first acoustic wave filter 10 in the pass band BW2 in the filter 100. The insertion loss decreases as the reflection coefficient Γ increases. The reflection coefficient Γ is preferably equal to or greater than 0.75, and is more preferably equal to or greater than 0.8. The above holds true for the reflection coefficient of the signal F2 in the pass band BW1.

As shown in FIG. 6, in order to easily realize impedance matching by the inductor L0 while keeping the phases of the signals F1 and F2 in the pass bands BW2 and BW1 substantially identical, at least a part of the phase of the signal F1 in the pass band BW2 overlaps with at least a part of the phase of the signal F2 in the pass band BW1. Preferably, the phase of one of the signal F1 in the pass band BW2 and the signal F2 in the pass band BW1 totally overlaps the other phase.

Figure 13:
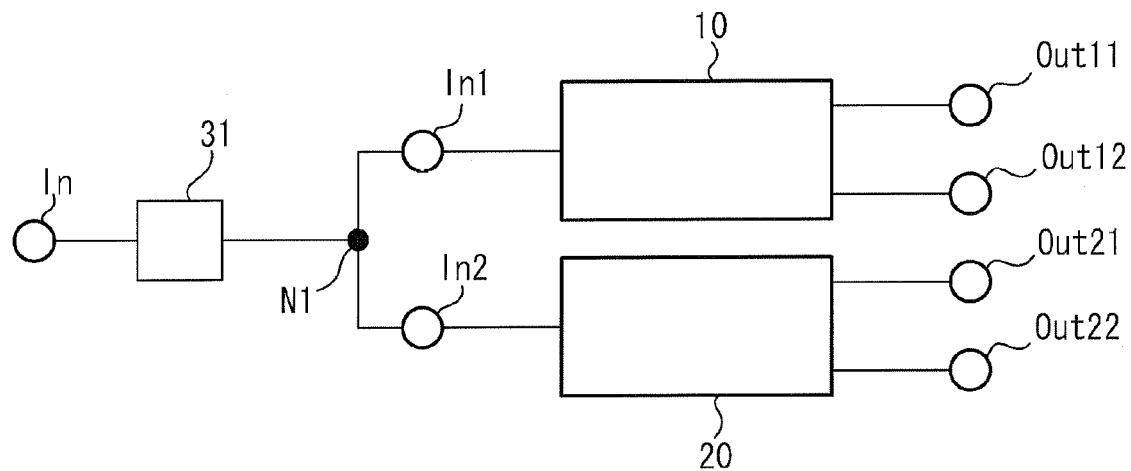
FIG. 13 is a block diagram of a matching circuit.

As shown in FIG. 13, a matching circuit 31 is preferably provided between the input (common) terminal In and the node N1 at which the input terminal In1 of the first acoustic wave filter 10 and the input terminal In2 of the second acoustic wave filter 20 are connected. The matching circuit 31 has the function of changing the phases of the pass bands BW1 and BW2, as shown in FIGS. 3 through 6. However, as shown in FIGS. 5A and 5B, preferably, the matching circuit 31 is an inductance component in order to cancel the capacitances C1 and C2 equivalently connected between the input terminal In and ground. Thus, as shown in FIG. 4, the matching circuit 31 is preferably the inductor L0 connected between the node N1 and ground.

The first acoustic wave filter 10 and the second acoustic wave filter 20 may be provided on separate piezoelectric substrates. Preferably, as shown in FIG. 1, the first and second acoustic wave filters 10 and 20 are formed on the identical piezoelectric substrate 50. This arrangement reduces the mount area. The piezoelectric substrate 50 may be made of lithium niobate or lithium tantalate.

Figure 14:
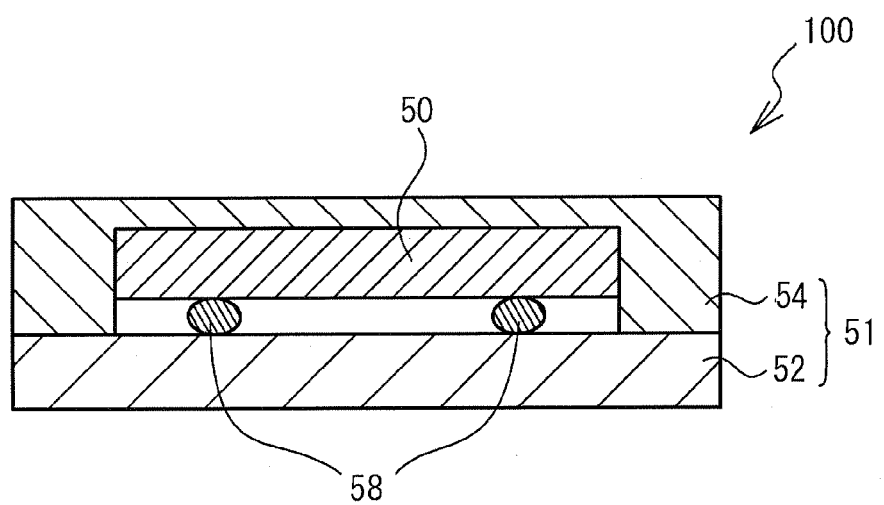
FIG. 14 is a cross-sectional view of the filter of the first embodiment.
Figure 15:
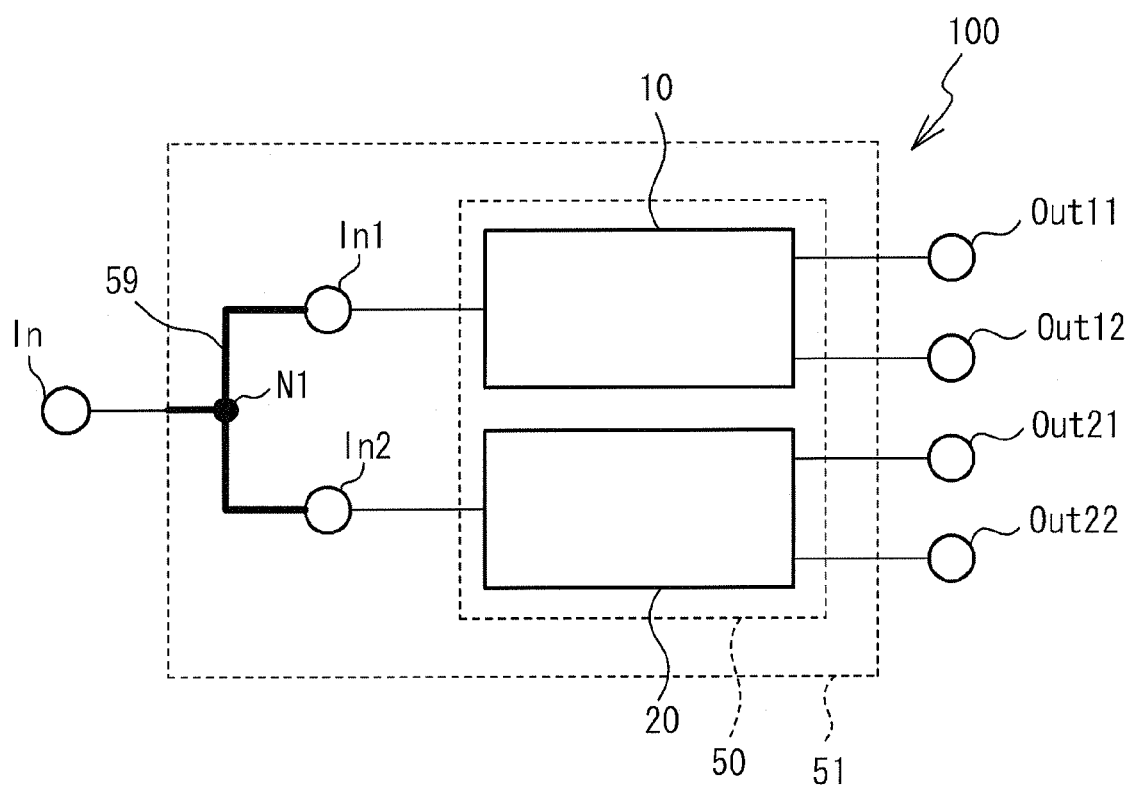
FIG. 15 shows an interconnection line connecting the input terminals of the first and second acoustic wave filters.

FIG. 14 is a schematic cross-sectional view of the filter 100 of the first embodiment, and FIG. 15 schematically shows the filter 100. Referring to FIG. 14, the filter 100 is composed of the piezoelectric substrate 50 on which the first and second acoustic wave filters 10 and 20 are formed, and a package 51. The package 51 is composed of a package substrate 52 and an exterior part 54. The piezoelectric substrate 50 is flip-chip mounted on the package substrate 52 by using bumps 58. The piezoelectric substrate 50 is covered with the exterior part 54. The first and second acoustic wave filters 10 and 20 are housed in the package 51.

Referring to FIG. 15, the input terminals In1 and In2 of the first and second acoustic wave filters 10 and 20 formed on the piezoelectric substrate 50 are connected to the package 51. In the package 51, interconnection lines 59 connect the input terminal In to the input terminals In1 and In2. Turning to FIG. 14 again, the bumps 58 connects the input terminals In1 and In2 and the package 51. The interconnection lines 59 that connect the input terminal In to the input terminals In1 and In2 are formed by a metal film formed on the package substrate 52.

The first and second acoustic wave filters 10 and 20 may be face-up mounted on the package 51. Preferably, at least one of the first and second acoustic wave filters 10 and 20 is flip-chip mounted on the package 51. Most preferably, both the first and second acoustic wave filters 10 and 20 are flip-chip mounted on the package 51. This arrangement reduces the mount area most efficiently.

In the first embodiment, as shown in FIG. 15, the interconnection lines 59 connecting the input terminals In1 and In2 of the first and second acoustic wave filters 10 and 20 are provided on the package 51. The input terminal In, the output terminals Out11 through Out22 are footpads provided on the package 51. The input terminals In1 and In2 are pads provided on the piezoelectric substrate 50. The input terminal In and the output terminals Out11 through Out22 may be pads provided on the piezoelectric substrate 50. That is, the interconnection lines connecting the input terminals In1 and In2 may be formed on the piezoelectric substrate 50.

Second Embodiment

Figure 16:
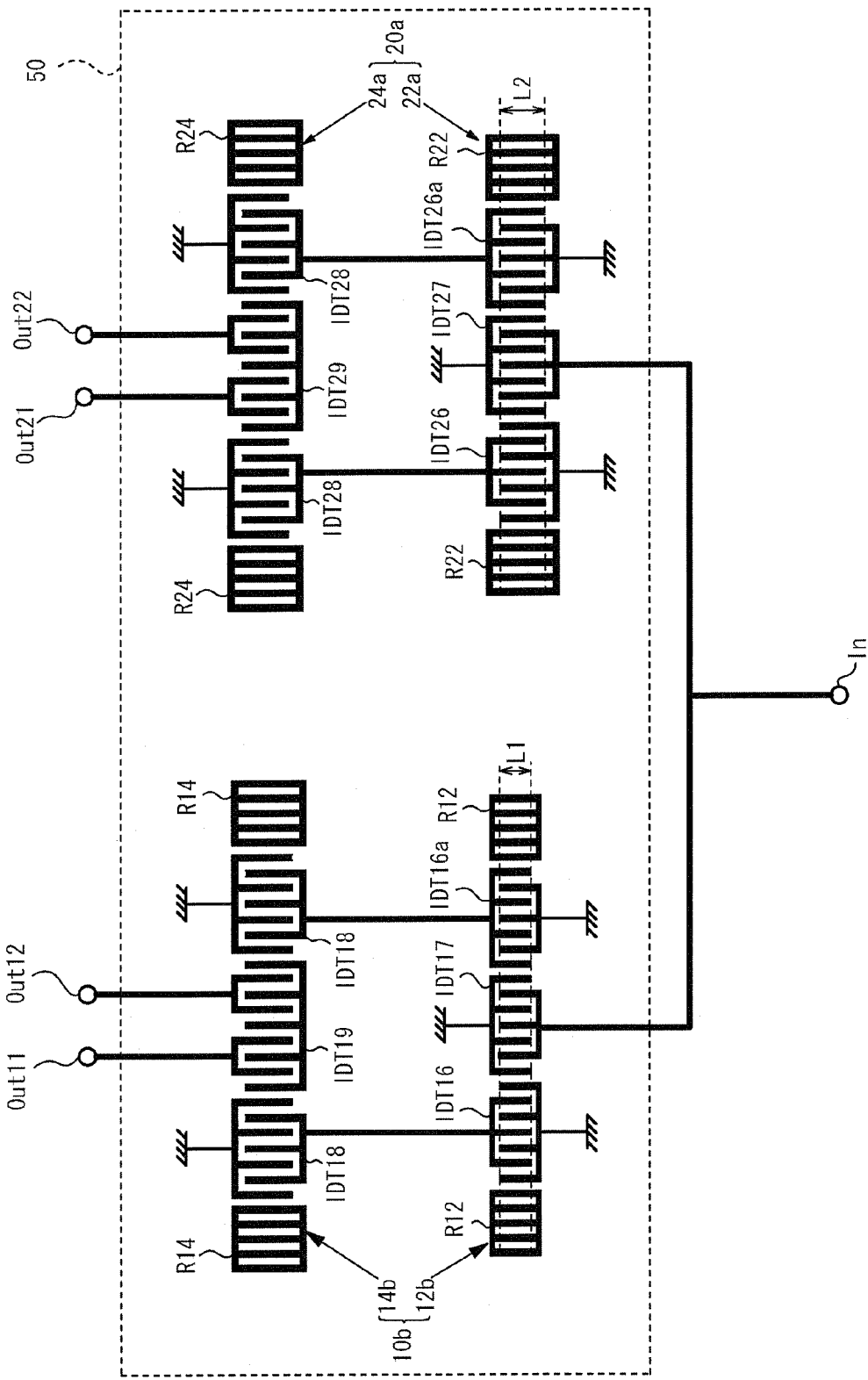
FIG. 16 is a schematic plan view of a filter in accordance with a second embodiment.

FIG. 16 is a schematic plan view of a filter in accordance with a second embodiment. The second embodiment differs from the first embodiment in that a first acoustic wave filter 10b has an arrangement such that the output IDTs 16 and 16a of a first multimode filter 12b have different arrangements of electrode fingers. In contrast, the two input IDTs 18 of an acoustic wave filter 14b have an identical arrangement of electrode fingers. A second acoustic wave filter 20a has an arrangement similar to the above-mentioned arrangement of the first acoustic wave filter 10b. Balanced output signals are available via the output terminals Out11 and Out12 of the second embodiment.

Third Embodiment

Figure 17A:
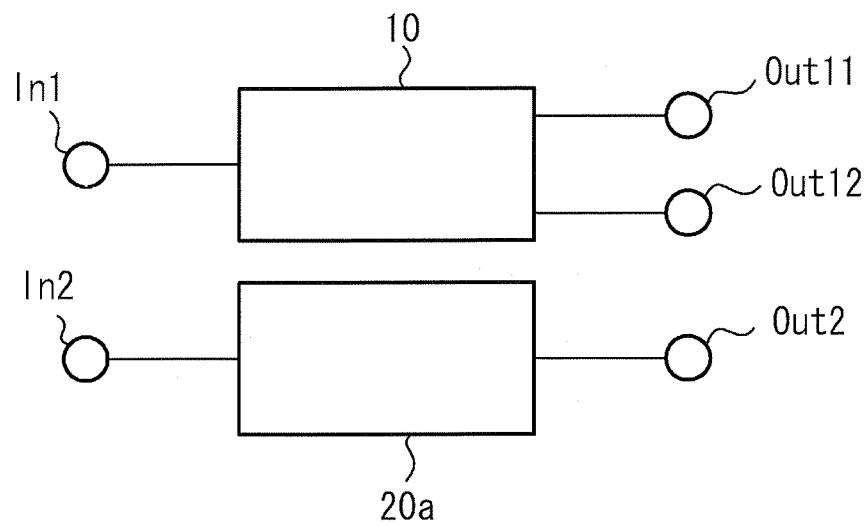
FIGS. 17A through 17C show exemplary structures of filters having unbalanced output configurations.
Figure 17B:
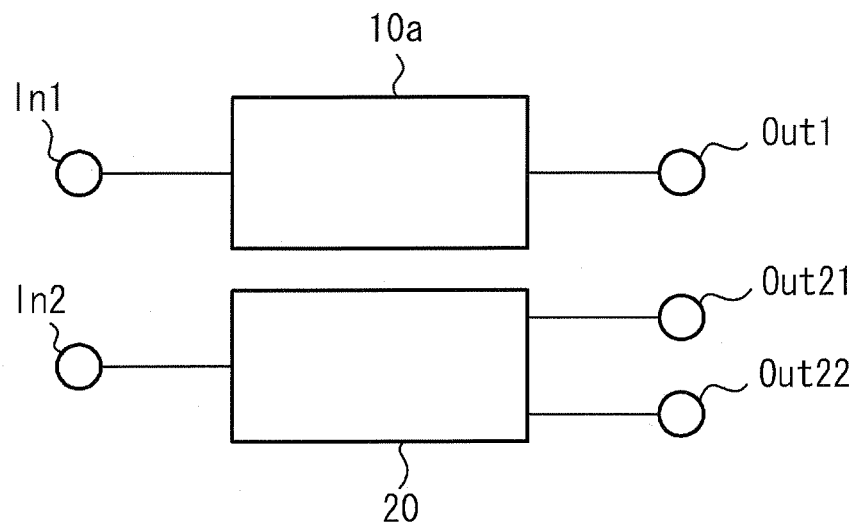
Figure 17C:
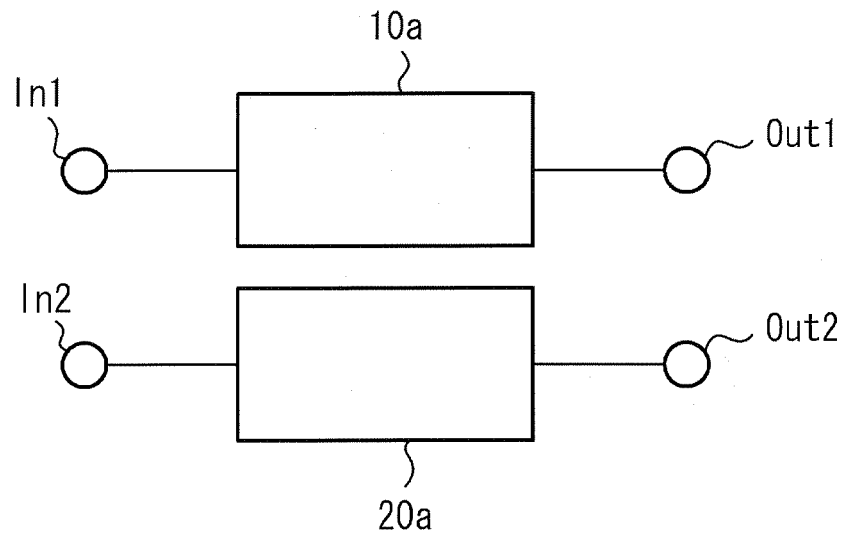

Each of the first and second acoustic wave filters 10 and 20 in the first and second embodiments outputs the balanced output signals. In this regards, other configurations shown in FIGS. 17A through 17C may be employed. FIG. 17A shows that the first acoustic wave filter 10 outputs the balanced output signals to the output terminals Out11 and Out12, and the second acoustic wave filter 20a outputs an unbalanced output signal to the output terminal Out2. FIG. 17B shows that a first acoustic wave filter 10a outputs an unbalanced output signal to the output terminal Out1, and the second acoustic wave filter 20 outputs balanced output signals to the output terminals Out21 and Out22. FIG. 17C shows that the first and second acoustic wave filters 10a and 20a output the respective unbalanced output signals to the output terminals Out1 and Out2.

Figure 18:
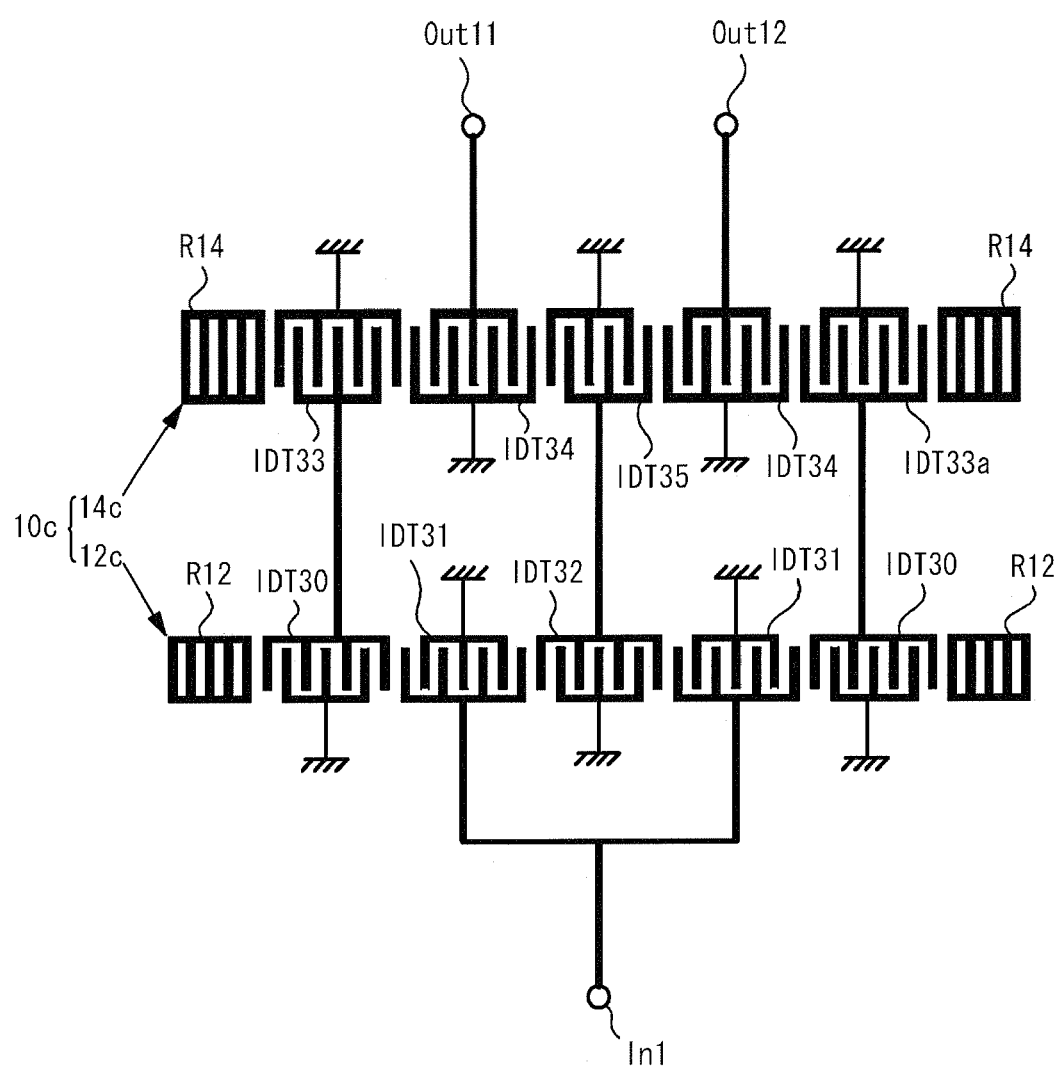
FIG. 18 shows a first exemplary acoustic wave filter having the balanced output configuration.
Figure 19:
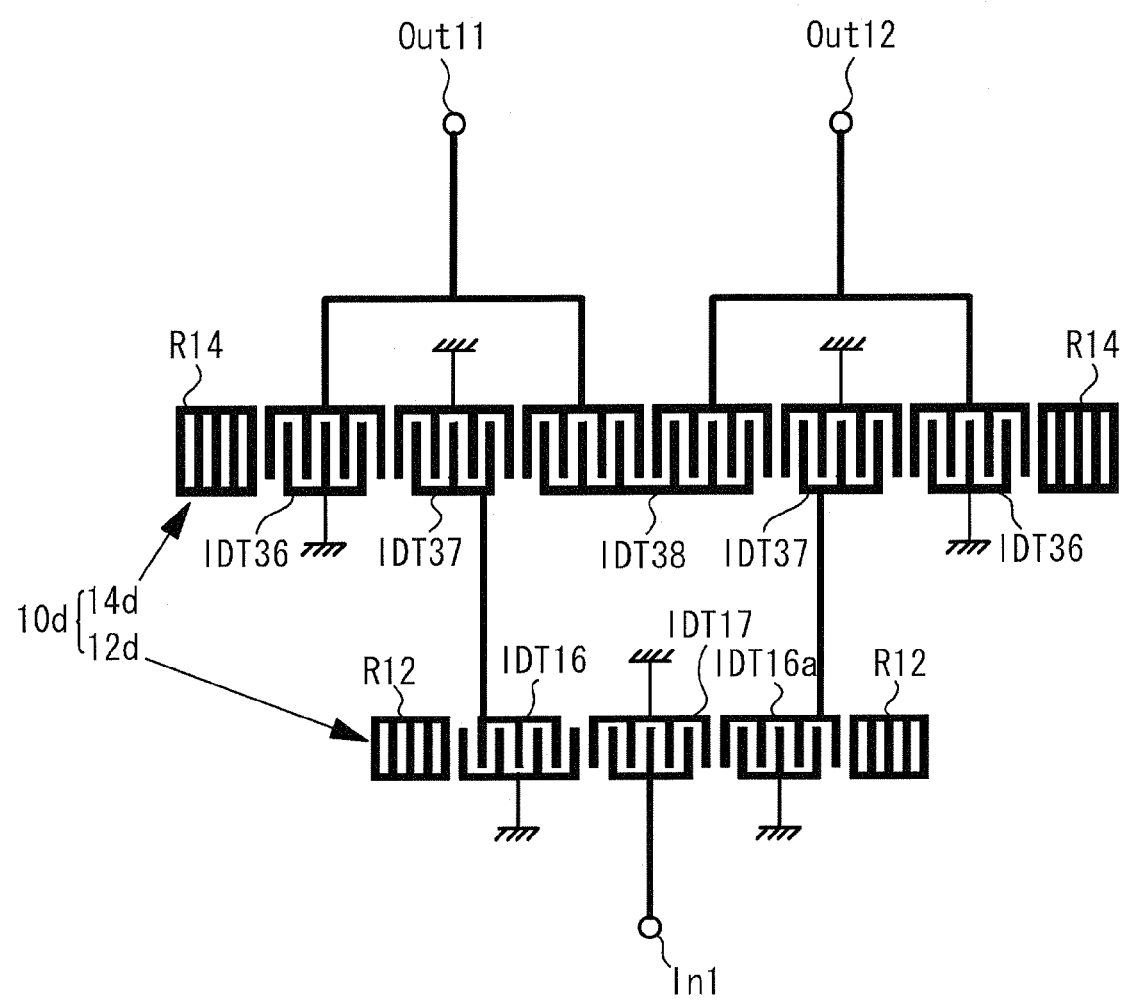
FIG. 19 shows a second exemplary acoustic wave filter having the balanced output configuration.
Figure 20:
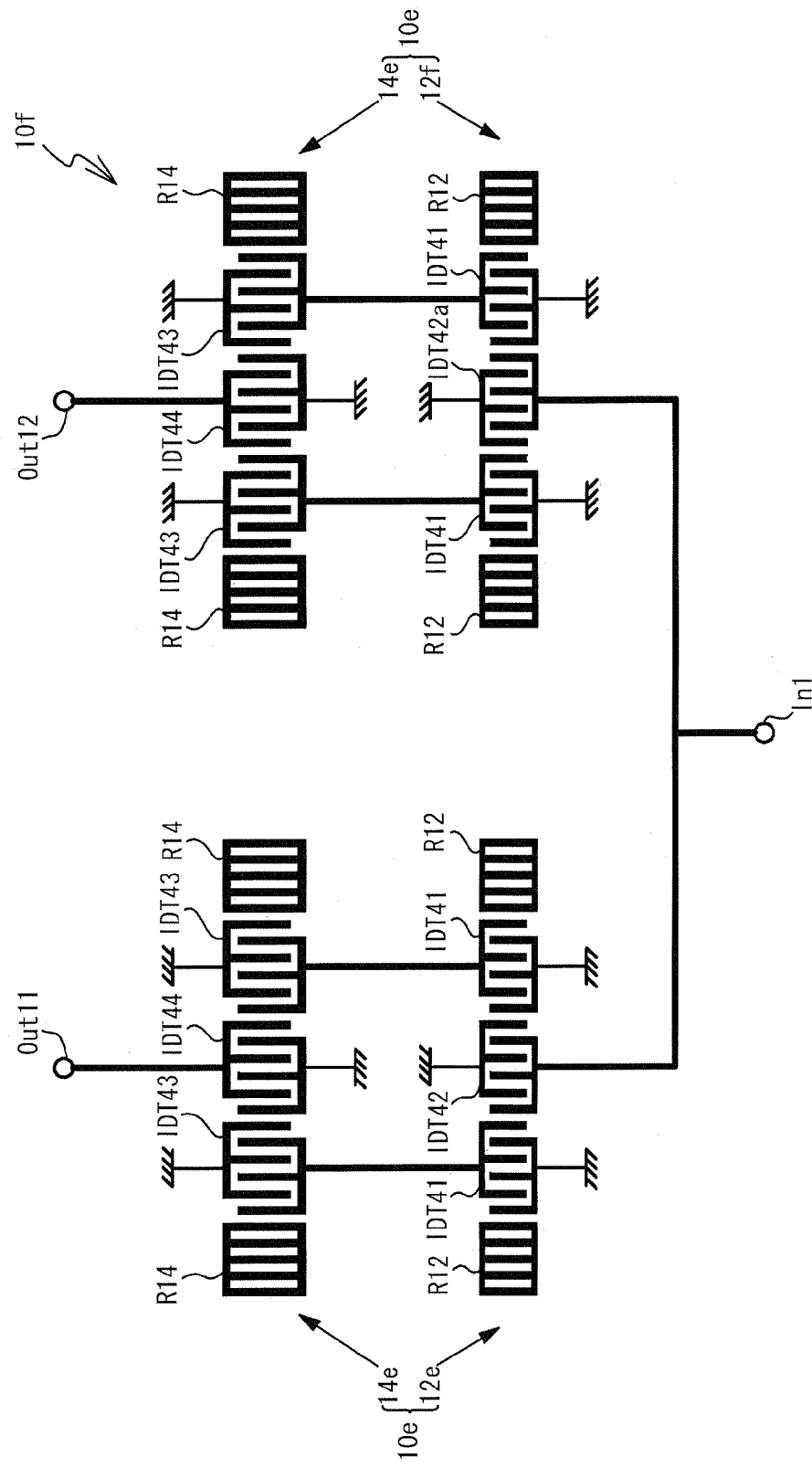
FIG. 20 shows a third exemplary acoustic wave filter having the balanced output configuration.

FIGS. 18 through 20 show exemplary structures of the first and second acoustic wave filters 10 and 20 capable of outputting balanced output signals.

Referring to FIG. 18, an acoustic wave filter 10c has a multimode filter 12c having five IDTs, and another multimode filter 14c having five IDTs, which filters are cascaded. The multimode filter 12c has two input IDTs 31 and three output IDTs 30 and 32. The multimode filter 14c has three input IDTs 33, 33a and 35, and two output IDTs 34. The input terminal In1 is connected to the input IDTs 31 of the multimode filter 12c. The three output IDTs 30 and 32 of the multimode filter 12c are connected to the three input IDTs 33, 33a and 35 of the multimode filter 14c, respectively. The two output terminals IDTs 34 of the multimode filter 14c are connected to the balanced output terminals Out11 and Out12, respectively.

Referring to FIG. 19, an acoustic wave filter 10d has a multimode filter 12d having three IDTs, and a multimode filter 14d having five IDTs, which filters are cascaded. The multimode filter 12d is the same as the multimode filter 12b of the second embodiment shown in FIG. 16, and a description thereof will be omitted. The multimode filter 14d has two input IDTs 37 and three output IDTs 36 and 38. The input terminal In1 is connected to the input IDT 17 of the multimode filter 12d. The two output IDTs 16 of the multimode filter 12d are connected to the two input IDTs 37 of the multimode filter 14d, respectively. The output IDTs 36 and 38 of the multimode filter 14d are connected to the balanced output terminals Out11 and Out12, respectively.

Referring to FIG. 20, an acoustic wave filter 10f has two acoustic wave filters 10e connected to the input terminal In1 in parallel. Each of the acoustic wave filters 10e has a multimode filter 12e or 12f having three IDTs, and a multimode filter 14e having three IDTs, wherein the multimode filters 12e and 12f are cascaded. The multimode filter 12e or 12f has one input IDT 42 or 42a and two output IDTs 41. The multimode filter 14e has two input IDTs 43 and one output IDT 44. The input IDTs 42 and 42a of the multimode filter 12e or 12f are connected to the input terminal In1. The two output IDTs 41 of the multimode filter 12e or 12f are connected to the two input IDTs 43 of the multimode filter 14e, respectively. The output IDTs 44 of the multimode filters 14e are connected to the balanced output terminals Out11 and Out12.

FIGS. 21 through 24 show exemplary structures of the first and second acoustic wave filters 10a and 20a having the unbalanced outputs.

Figure 21:
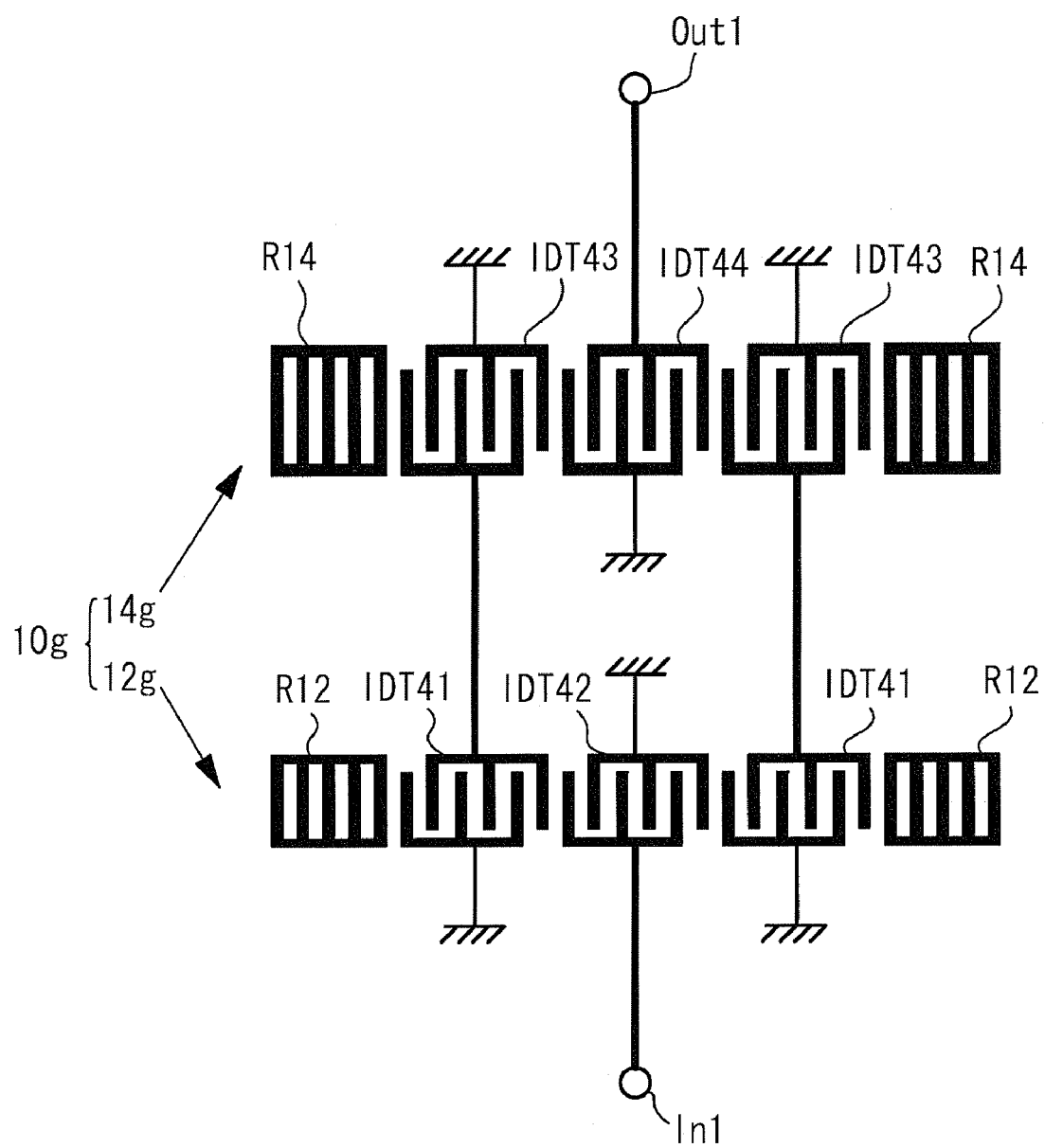
FIG. 21 shows a first exemplary acoustic wave filter having the unbalanced output configuration.

Referring to FIG. 21, an acoustic wave filter 10g has a multimode filter 12g having three IDTs, and a multimode filter 14g having three IDTs, which filters are cascaded. The multimode filters 12g and 14g are the same as the multimode filters 12e and 14e shown in FIG. 20, respectively, and a description thereof will be omitted. An input IDT 42 of the multimode filter 12g is connected to the unbalanced input terminal In1, and an output IDT 44 of the multimode filter 14g is connected to the unbalanced output terminal Out1.

Figure 22:
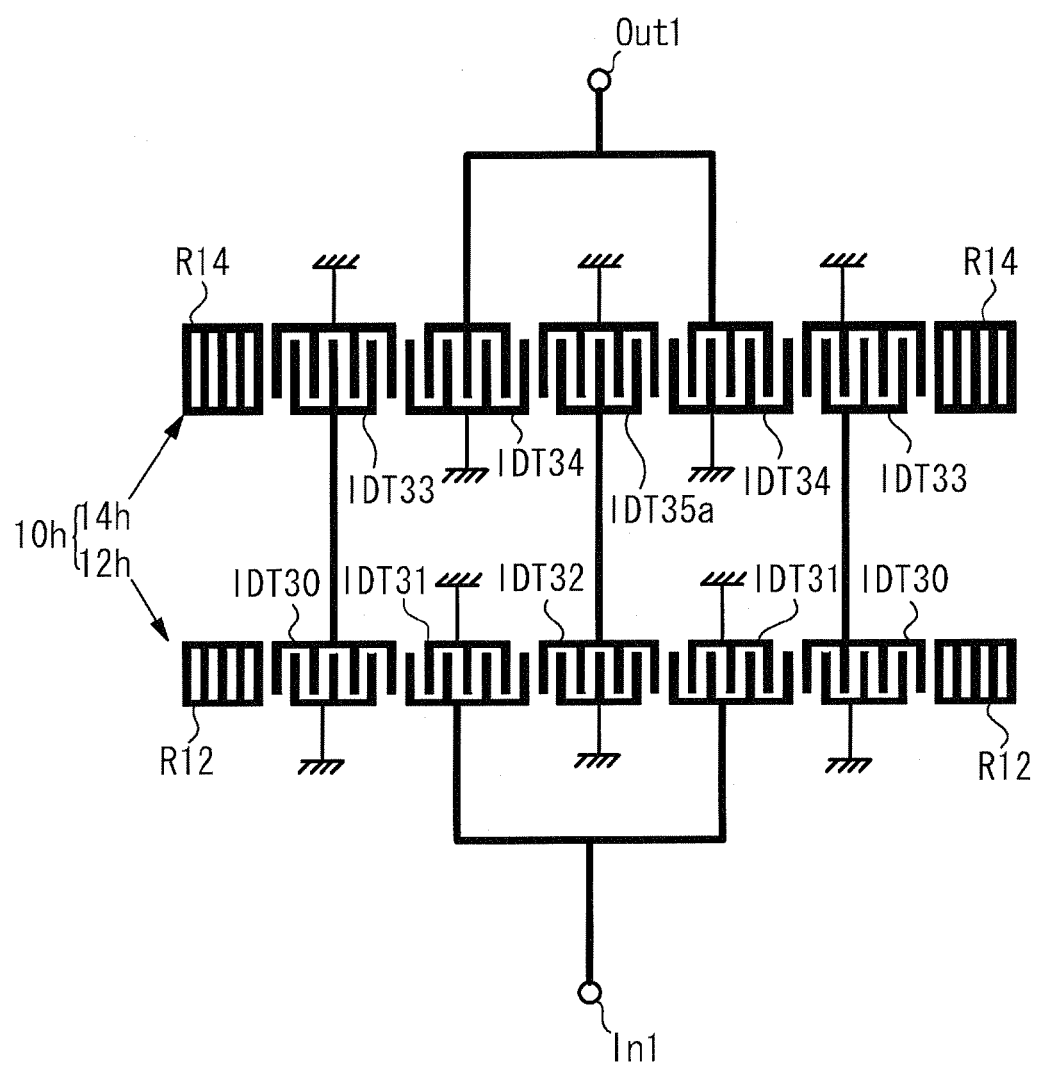
FIG. 22 shows a second exemplary acoustic wave filter having the unbalanced output configuration.

Referring to FIG. 22, an acoustic wave filter 10h has a multimode filter 12h having five IDTs and a multimode filter 14h having five IDTs, which filters are cascaded. The multimode filter 12h is the same as the multimode filter 12c shown in FIG. 18, and a description thereof will be omitted. The multimode filter 14h has three input IDTs 33 and 35a, and two output IDTs 34. The input IDT 31 of the multimode filter 12h is connected to the unbalanced input terminal In1. The three output IDTs 30 and 32 of the multimode filter 12h are connected to the three input IDTs 33 and 35a of the multimode filter 14h. The output IDT 34 of the multimode filter 14h is connected to the unbalanced output terminal Out1.

Figure 23:
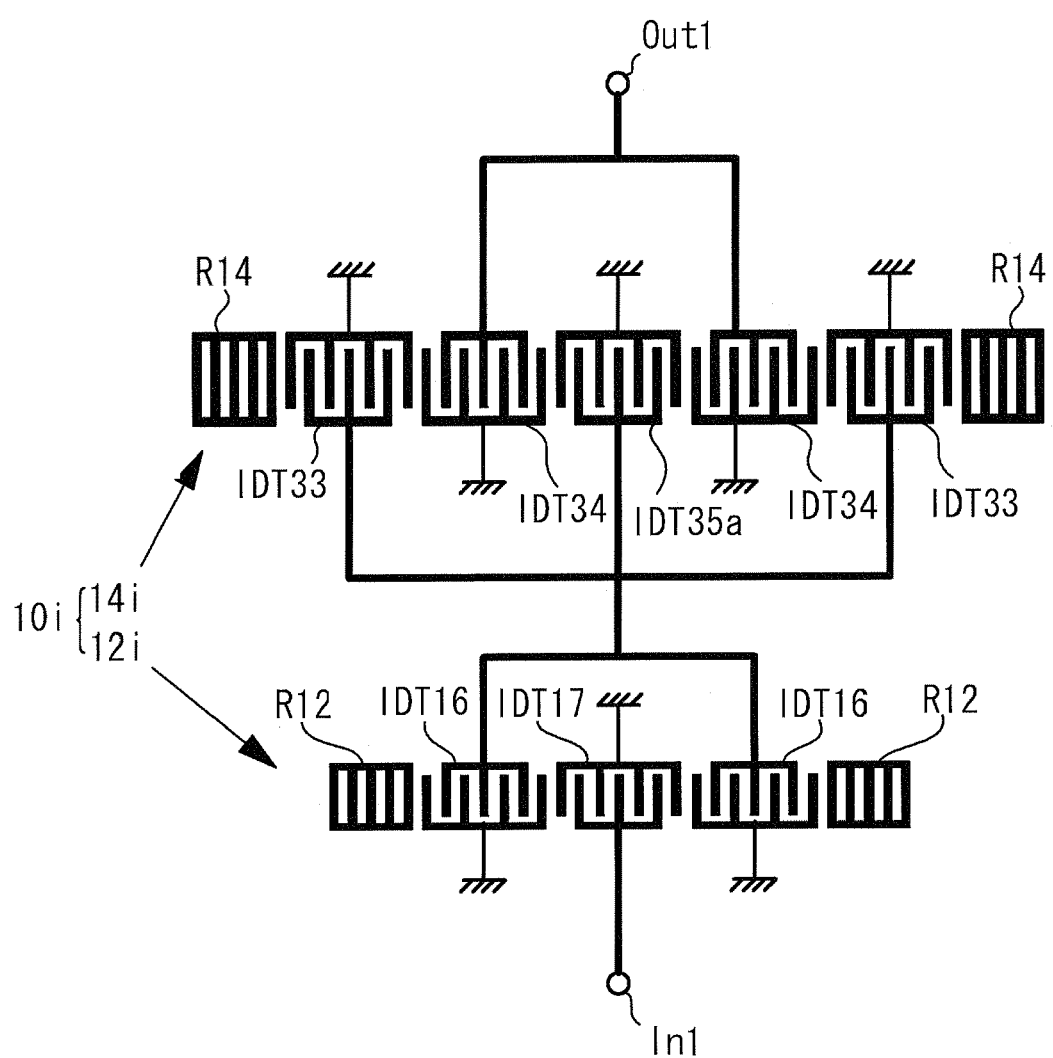
FIG. 23 shows a third exemplary acoustic wave filter having the unbalanced output configuration.

Referring to FIG. 23, an acoustic wave filter 10i has a multimode filter 12i having three IDTs, and a multimode filter 14i having five IDTs, which filters are cascaded. The multimode filter 12i has the same structure as that of the first multimode filter of the first embodiment shown in FIG. 1, and a description thereof will be omitted. The multimode filter 14i has the same structure as that of the multimode filter 14h shown in FIG. 22, and a description thereof will be omitted. One input IDT 17 of the multimode filter 12i is connected to the unbalanced input terminal In1. Two output IDTs 16 of the multimode filter 12i are connected together and are further connected to the three input IDTs 33 and 35a of the multimode filter 14i. The output IDT 34 of the multimode filter 14i is connected to the unbalanced output terminal Out1.

Figure 24:
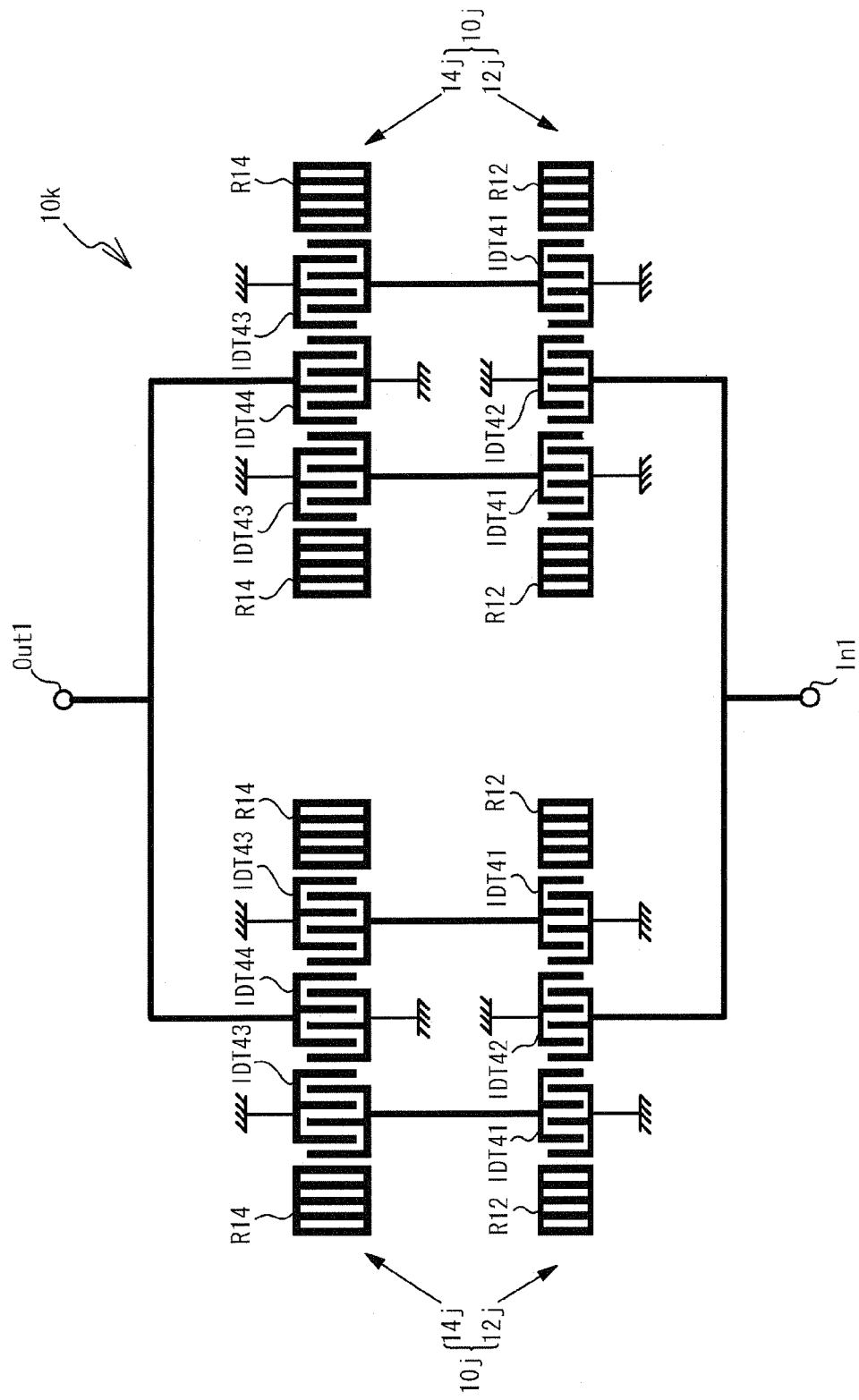
FIG. 24 shows a fourth exemplary acoustic wave filter having the unbalanced output configuration.

Referring to FIG. 24, an acoustic wave filter 10k has two multimode filters 10j connected in parallel. Each of the multimode filters 10j has a multimode filter 12j having three IDTs, and a multimode filter 14j having three IDTs. Each of the multimode filter 12j has one input IDT 42 and two output IDTs 41. Each of the multimode filters 14j has two input IDTs 43 and one output IDT 44. The input IDT 42 of each of the multimode filters 12j is connected to the unbalanced input terminal In1. The two output IDTs 41 of each of the multimode filters 12i are connected to the two input IDTs 43 of the each of the multimode filters 14j. The output IDT 44 of each of the multimode filters 14j is connected to the unbalanced output terminal Out1.

The filters shown in FIGS. 18 through 20 may be applied to the first and second acoustic wave filters 10 and 20 having two balanced outputs shown in FIGS. 17A and 17B. At least one of the first and second acoustic wave filters 10 and 20 may have the balanced output configuration. The two balanced output signals are 180° out of phase. The filters shown in FIGS. 21 through 24 may be applied to the first and second acoustic wave filters 10a and 20a of the unbalanced output type shown in FIGS. 17A through 17C. At least one of the first and second acoustic wave filters 10a and 20a may have the unbalanced output configuration.

The aperture length L1 of the first multimode filter 12 of the input stage of the first acoustic wave filter 10 differs from the aperture length L2 of the second multimode filter 14 of the second acoustic wave filter 20 regardless of whether the filter output has the unbalanced or balanced configuration. It is thus possible to overlap the phase of the signal F1 in the pass band BW2 and the phase of the signal F2 in the pass band BW1 with each other.

The first acoustic wave filters 10 and 10a and the second acoustic wave filters 20 and 20a may be configured so that multiple acoustic wave filters are connected in parallel, as shown in FIGS. 20 through 24. The first acoustic wave filters 10 and 10a and the second acoustic wave filters 20 and 20a may be essentially configured so that multiple acoustic wave filters are cascaded and the one of the filters at the input stage is a multimode filter.

The above-mentioned two filters consisting of the first and second acoustic wave filters 10 and 20 are connected in parallel. The present invention is not limited to the two filters but may include another arrangement in which three or more acoustic wave filters are connected in parallel. This arrangement requires a configuration so that multimode filters of the input stage of at least two of the three or more acoustic wave filters have different aperture lengths. The acoustic wave filers may be SAW filters or boundary acoustic wave filters.

The present invention is not limited to the specifically disclosed embodiments, but includes other embodiments and variations without departing from the scope of the present invention.

The present application is based on Japanese Patent Application No. 2007-003930 filed on Jan. 11, 2007, the entire disclosure of which is hereby incorporated by reference.

What is claimed is:

1. A filter comprising:
a first acoustic wave filter having acoustic wave filters cascaded, an input stage of the acoustic wave filters including a first multimode filter;
a second acoustic wave filter having acoustic wave filters cascaded, an input stage of these acoustic wave filters including a second multimode filter having an aperture length different from that of the first multimode filter, the second acoustic wave filter receiving an unbalanced in signal applied to the first acoustic wave filter, and having a pass band that does not overlap with that of the first acoustic wave filter.

2. The filter as claimed in claim 1, wherein at least one of the first acoustic wave filter and the second acoustic wave filter has balanced outputs.

3. The filter as claimed in claim 2, wherein the balanced outputs are 180° out of phase.

4. The filter as claimed in claim 1, further comprising a node to which an input of the first acoustic wave filter and an input of the second acoustic wave filter are connected.

5. The filter as claimed in claim 4, further comprising a matching circuit provided between the node and a common terminal to which the unbalanced input signal is applied.

6. The filter as claimed in claim 5, wherein the matching circuit includes an inductor connected between the node and ground.

7. The filter as claimed in claim 1, further comprising a package on which the first acoustic wave filter and the second acoustic wave filter are mounted, and an interconnection line connecting an input of the first acoustic wave filter and an input of the second acoustic wave filter, wherein the interconnection line is provided on the package.

8. The filter as claimed in claim 1, further comprising a piezoelectric substrate on which the first acoustic wave filter and the second acoustic wave filter are provided.

9. The filter as claimed in claim 1, further comprising a package on which the first acoustic wave filter and the second acoustic wave filter are mounted, and a piezoelectric substrate on which at least one of the first acoustic wave filter and the second acoustic wave filter is flip-chip mounted.

* * * * *